(12) United States Patent
Hastings

(10) Patent No.: US 7,352,231 B2
(45) Date of Patent: Apr. 1, 2008

(54) METHOD AND CIRCUIT FOR PERTURBING REMOVABLE SINGULARITIES IN COUPLED TRANSLINEAR LOOPS

(75) Inventor: Roy Alan Hastings, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 644 days.

(21) Appl. No.: 10/615,354

(22) Filed: Jul. 7, 2003

(65) Prior Publication Data

US 2005/0007177 A1    Jan. 13, 2005

Related U.S. Application Data

(60) Provisional application No. 60/444,165, filed on Jan. 30, 2003.

(51) Int. Cl.
*G06G 7/20* (2006.01)

(52) U.S. Cl. ................................ 327/346; 327/362

(58) Field of Classification Search ............ 327/362, 327/346, 108
See application file for complete search history.

(56) References Cited

U.S. PATENT DOCUMENTS

| | | | |
|---|---|---|---|
| 4,323,797 A | 4/1982 | Embree et al. | |
| 5,134,355 A | 7/1992 | Hastings et al. | |
| 6,074,082 A | 6/2000 | Gilbert | |
| 6,842,050 B2* | 1/2005 | Hastings et al. | 327/58 |
| 6,999,292 B2* | 2/2006 | Clara et al. | 361/91.1 |

2002/0018526 A1    2/2002  Osaka et al.

OTHER PUBLICATIONS

Hastings, The ART of Analog Layout, Prentice Hall, 2001, pp. 318-322.
Gilbert, "Current-mode Circuits From A Translinear Viewpoint: A Tutorial", in Lidgey et al., Analogue IC design: the current-mode approach, 1999, p. 19.
Hastings, Integrated MOSFET Interface for a Synchronously-Rectified SMPS, Proc. of the 1995 Bipolar/BiCMOS Circuits and Technology Meeting, 1995, pp. 58-61.
Hastings A. "Integrated MOSFET interface for a synchronously-rectified SMPS" Bipolar/BICMOS Circuits and Technology Metting, 1995. Proceedings of the 1995 Minneapolis, MN, USA Oct. 2-3, 1995, New York, NY, USA, IEEE, US, Oct. 2, 1995, pp. 58-61, XP010159317 ISBN: 0-7803-2778-0 p. 60, right-hand column, line 16-p. 61, left-hand column, line 2; figure 5.

* cited by examiner

*Primary Examiner*—Dinh T. Le
(74) *Attorney, Agent, or Firm*—Wade J. Brady, III; Frederick J. Telecky, Jr.

(57) ABSTRACT

A translinear network (34) has first ($Q_1$, $Q_2$, $Q_3$, $Q_4$) and second ($Q_4$, $Q_3$, $Q_5$, $Q_6$) translinear loops. A Trafton-Hastings clamp circuit (36) is connected to generate a piecewise-polynomial-continuous current $I_y$, the value of which becomes undefined when current $I_x$=0 due to a removable singularity in the transfer equation at this point. A current mirror (38) comprising a plurality of transistors ($M_1$, $M_2$, $M_3$) is coupled to the Trafton-Hastings clamp circuit (36), and operates to add additional currents in transistors $Q_3$ and $Q_5$ to $I_x$, when the Trafton-Hastings clamp transistor ($Q_7$) conducts, so as to perturb the removable singularity in the transfer equation into the left half-plane.

18 Claims, 3 Drawing Sheets

METHOD AND CIRCUIT FOR PERTURBING REMOVABLE SINGULARITIES IN COUPLED TRANSLINEAR LOOPS

This application claims priority under 35 USC § 119 of provisional application Serial No. 60/444,165, filed Jan. 30, 2003. The present application is a Non-Provisional of the above identified application.

BACKGROUND OF THE INVENTION

1. Field of the Invention

This invention relates to improvements in translinear circuits, and more particularly to circuits that employ a translinear principle, and still more particularly to improvements in translinear loops that reduce or remove the effects of singularities that may exist, and still yet more particularly to improvements in translinear loops of the type that may be used in piecewise-polynomial-continuous function generators, reciprocators, or like circuits that have a P/Q polynomial transfer function form.

2. Relevant Background

When a bipolar transistor is operated in its forward active region, the relationship between its collector current $I_C$ and its base-emitter voltage $V_{BE}$ is $$I_C = I_S \exp\left(\frac{V_{BE}}{nV_T} - 1\right) \quad [1]$$

where $I_S$ is the saturation current, n is the emission coefficient, and $V_T$ is the thermal voltage. Assuming that the transistor operates in low-level injection, the emission coefficient lies very close to unity and can usually be neglected. Assuming that the current levels are not too small, the "−1" term can be ignored, and equation [1] simplifies to $$I_C = I_S \exp\left(\frac{V_{BE}}{V_T}\right) \quad [2]$$

Solving this equation for $V_{BE}$ gives $$V_{BE} = V_T \ln\left(\frac{I_C}{I_S}\right) \quad [3]$$

The saturation current $I_S$ that appears in these equations is actually the product of emitter area $A_E$ and saturation current density $J_S$, $$I_S = A_E J_S \quad [4]$$

The collector current obeys this equation over a large range of currents, typically spanning some five or six decades of current. A large class of circuits exists that use this relationship to perform analog signal processing. Many of these circuits contain a translinear loop, which is used herein to mean a loop of forward-biased junctions, half of which are oriented in a clockwise direction, and half in a counterclockwise direction. FIG. 1A shows an example of a circuit 10 that contains a translinear loop, and FIG. 1B shows a circuit 12 that illustrates this loop.

In the circuit 10 of FIG. 1A, to which reference is first made, the left side of the loop includes two NPN transistors $Q_1$ and $Q_2$, respectively in series with current sources by IA and IB. The current source IA is connected between the supply line and the collector of $Q_1$ and the current source IB is connected between the emitter of transistor $Q_2$ and the reference potential. Similarly, the right half of the loop 10 has two transistors $Q_3$ and $Q_4$. A current source IC is connected between the emitter of transistor $Q_3$ and the reference potential, and the collector of transistor $Q_4$ serves as the output.

The circuit diagram of FIG. 1B, to which reference is now additionally made, is a diagrammatic illustration of the relationship among the transistors $Q_1$, $Q_2$, $Q_3$, and $Q_4$. As can be seen, the transistors $Q_1$ and $Q_2$ define a counterclockwise voltage path, and transistors $Q_3$ and $Q_4$ define a clockwise voltage path.

Applying Kirchoff's voltage law to the translinear loop of FIG. 1 gives the equation $$V_{BE1} + V_{BE2} = V_{BE3} + V_{BE4} \quad [5]$$

Substituting equation [3] into equation [5] gives $$V_T \ln\left(\frac{I_A}{I_{S1}}\right) + V_T \ln\left(\frac{I_B}{I_{S2}}\right) = V_T \ln\left(\frac{I_C}{I_{S3}}\right) + V_T \ln\left(\frac{I_D}{I_{S4}}\right) \quad [6]$$

Substituting equation [4] in for all the saturation currents and reducing the equation gives $$\frac{I_A I_B}{A_{E1} A_{E2}} = \frac{I_C I_D}{A_{E3} A_{E4}} \quad [7]$$

If all four transistors have the same emitter area, then the output current $I_D$ equals $$I_D = \frac{I_A I_B}{I_C} \quad [8]$$

The translinear circuit of FIG. 1 is an example of a broad class of translinear circuits, all of which can be analyzed in a manner similar to that given above. The generalized form of equation [6] becomes $$\sum_{CW} V_{BE} = \sum_{CCW} V_{BE} \quad [9]$$

where CW and CCW stand for clockwise- and counterclockwise-oriented junctions. The generalized form of equation [7] then reduces to $$\prod_{CW} \frac{I_C}{A_E} = \prod_{CCW} \frac{I_C}{A_E} \quad [10]$$

If the collector current density is defined as $J \equiv I_C/A_E$, then equation [10] simplifies to $$\prod_{CW} J = \prod_{CCW} J \quad [11]$$

This equation is the most succinct version of the translinear principle, first formulated by Barrie Gilbert, which he stated as follows: "In a closed loop containing an even number of forward-biased junctions, arranged so that there are an equal number of clockwise-facing and counterclockwise-facing polarities, the product of the current densities in the clockwise direction is equal to the product of the current densities in the counterclockwise direction."

One of the uses for translinear circuits of the type to which the present invention pertains is to provide polynomial function generators. One classical translinear circuit is the one-quadrant multiplier 10, the four-term version of which is shown in FIG. 1. This circuit can be elaborated to any even number of terms by cascading additional transistors below $Q_1$ and $Q_4$. An arbitrary one-quadrant multiplier of this sort can synthesize any polynomial function P/Q, where P and Q are products of positive linear combinations of an arbitrary number of input variables, such as $$Y = \frac{(X_1 - 3)(X_2 + 2X_1)}{3X_3} \qquad [12]$$

There exists a larger superset of piecewise-polynomial-continuous functions. For such a function, the range of the independent variables $X_i$ is divided into N>1 separate regions, in each of which the function is defined by a polynomial of the form P/Q. Furthermore, the function itself is continuous, although its derivatives generally are not.

Piecewise-polynomial-continuous functions are often encountered when attempting to limit a function, for example when constructing a reciprocator (a circuit that can implement the function Y=1/X). If the circuit is properly constructed, base current errors are minimized to such a degree that the circuit will consume extravagant amounts of current as it approaches the singularity at X=0. To rectify this problem, a practical reciprocator is best constructed using a piecewise-polynomial-continuous function of the form:

$$Y = \begin{cases} 1/X & \text{if } X > K \\ 1/K & \text{if } X \leq K \end{cases} \qquad [13]$$

Piecewise-polynomial-continuous functions of N regions can be implemented using N meshed translinear loops, using a circuit technique known as a Trafton-Hastings clamp, herein sometimes referred to as a T/H clamp. An original form of the T/H clamp is shown in U.S. Pat. No. 5,134,355, assigned to the assignee hereof U.S. Pat. No. 5,134,355 is incorporated in its entirety herein by reference.

One version of the T/H clamp incorporated into a reciprocator 14 realized using a four-term one-quadrant multiplier is shown in FIG. 2. The reciprocator circuit 14 includes three limbs, limb 16 oriented counterclockwise and limbs 18 and 20 oriented clockwise. A T/H clamp is provided by transistor $Q_7$, which is connected between the collector of $Q_1$ and base of the $Q_2$ and the reference potential. The base of the T/H clamp is connected to the collector of the second transistor in the limb 18. The output of the circuit is derived at the collector of transistor $Q_6$. The circuit of FIG. 2 has been simplified by the elimination of the beta correction circuitry, which is generally necessary in order for a practical circuit to function adequately.

Details of beta corrector circuitry in conjunction with the reciprocator circuit 14 of FIG. 2 are shown in the circuit 22 FIG. 3, to which reference is now additionally made. The circuit 22 is an example of a piecewise-polynomial-continuous translinear network with two output limbs 24 and 26. Output limb 24 includes transistors $Q_3$ and $Q_4$, used in the beta corrector, and output limb 26 includes transistors $Q_7$ and $Q_8$ that generate the actual output current. The output limbs 24 and 26 are duplicates of one another, ensuring that the emitter of transistor $Q_{10}$ sees a current equal to $I_Y$ (neglecting Early voltage and similar nonidealities).

Transistor $Q_{10}$ generates a base current approximately equal to $I_Y/\beta$; actually this current $I_B$ equals $$I_B = \frac{\beta - 1}{\beta^2} I_Y \qquad [14]$$

This current is mirrored by $M_1$-$M_2$, and is fed back to the base of $Q_4$ to correct for the base current consumed by this transistor. The beta-correction current generated by this circuit must be less than $I_Y/\beta$, or positive feedback around the loop $Q_4$-$Q_{10}$-$M_1$-$M_2$ will cause the circuit to latch up. To ensure that this does not happen, the current ratio of current mirror $M_1$-$M_2$ is usually reduced to about 90%. This means that the circuit compensates for about 90% of the base current error at $Q_4$. Because the collector current of transistor $Q_4$ increases as $I_X$ decreases, a high degree of beta correction is required to ensure a reasonable degree of accuracy within the circuit; 90% is typically insufficient. Therefore, the second and independent output limb 26 that includes transistors $Q_7$ and $Q_8$ is inserted, and the mirror transistors $M_1$ and $M_4$ are made equal in size. No risk of runaway positive feedback exists, as no loop closes around $M_1$ and $M_4$. This two-stage beta correction scheme therefore generally provides an effective beta correction approaching 99%.

Beta helper transistor $Q_9$ has been inserted to compensate for the base currents of transistors $Q_2$, $Q_3$, $Q_5$ and $Q_7$. No beta correction circuitry has been added for transistor $Q_1$, but by making $I_{C2}$ relatively large, and adjusting the emitter areas so that $I_{C1}$ is relatively small, the base current error introduced by transistor $Q_1$ can be reduced to inconsequential proportions.

With reference again to FIG. 2, the circuit 14 contains three identifiable translinear loops: $Q_1$-$Q_2$-$Q_3$-$Q_4$, $Q_1$-$Q_2$-$Q_5$-$Q_6$, and $Q_4$-$Q_3$-$Q_5$-$Q_6$. Although the circuit can be analyzed by applying the classical translinear principle to these three loops, it is more profitable to analyze the circuit as a mesh of three branches: $Q_1$-$Q_2$, $Q_3$-$Q_4$, and $Q_5$-$Q_6$. The equivalent of equation [5] now becomes $$V_{BE1} + V_{BE2} = V_{BE3} + V_{BE4} = V_{BE5} + V_{BE6} \qquad [15]$$

Applying the translinear principle, we find the equivalent of equation [7] to be $$\frac{I_{C1} I_{C2}}{A_{E1} A_{E2}} = \frac{I_{C3} I_{C4}}{A_{E3} A_{E4}} = \frac{I_{C5} I_{C6}}{A_{E5} A_{E6}} \qquad [16]$$

If we assume that all of the emitter areas are equal, and we substitute in the value of the currents feeding the various transistors, the above equation simplifies to $$I_{C1} I_B = I_X I_{C4} = I_X I_Y \qquad [17]$$

By comparing the second and third terms of the equality, we see that (barring singularities) $I_{C4}$ equals $I_Y$. If this current is less than $I_C$, then the voltage at node $N_1$ is high, and Trafton-Hastings clamp transistor $Q_7$ is off. Then current $I_{C1}$ equals $I_A$, and we can use the first and third terms of equality [16] to find $I_Y$:

$$I_Y = \frac{I_A I_B}{I_X} \quad [18]$$

If the current $I_{C4}$ is greater than $I_{C1}$ then the voltage at $N_1$ drops and $Q_7$ begins to conduct. This draws current away from transistor $Q_1$ until the current $I_{C4}$ rises to just equal $I_C$. Now we can use the second and third terms of equality [16] to find $I_Y$:

$$I_Y = \frac{I_X}{I_X} I_C \quad [19]$$

So long as $I_Y \neq 0$, equation [18] simplifies to $I_X = I_C$. Combining this with equation [17], we find that the function implemented by the circuit 14 of FIG. 2 is:

$$I_Y = \begin{cases} \frac{I_A I_B}{I_X} & \text{for} \quad I_X > \frac{I_A I_B}{I_C} \\ I_C & \text{for} \quad 0 < I_X \leq \frac{I_A I_B}{I_C} \end{cases} \quad [20]$$

Comparison of equation [20] with equation [13] shows their essential similarity. The presence of terms $I_A$ and $I_B$, both of which are assumed to be constants, is necessary in order to balance the physical units of the equation, if for no other reason. Their presence in no way lessens the similarity between the functions of equations [13] and [20]. The role of constant K in equation [13] is played by the quantity $I_A I_B / I_C$ in equation [20]. Again, since $I_A$ and $I_B$ are constants, there are no essential differences. Since the reciprocator was based on a one-quadrant circuit, we do not expect operation to be defined for $I_X < 0$. However, operation is also not defined for $I_X = 0$, as a singularity is present at this point.

FIG. 4 shows a simplified schematic 30 of the circuit 14 of FIG. 2. This schematic 30 illustrates the three limbs of the mesh: $Q_1$-$Q_2$, $Q_3$-$Q_4$ and $Q_5$-$Q_6$. The three limbs may be referred to as the reference limb ($Q_1$-$Q_2$), the control limb ($Q_3$-$Q_4$) and the output limb ($Q_5$-$Q_6$). The control and reference limbs are linked by a Trafton-Hastings clamp, which shunts away current from the reference transistor when the current flowing through the control transistor exceeds a limiting value set by a current source (this current source being part of the Trafton-Hastings clamp). The Trafton-Hastings clamp is most often implemented using a bipolar PNP transistor whose base is connected to the collector of the control transistor and whose emitter is connected to draw current away from the reference transistor. Alternative implementations can easily be envisioned, such as using a PMOS transistor rather than a PNP transistor, or substituting an operational amplifier for the transistor. Further, $Q_1$ may be referred to as the reference transistor, $Q_4$ as the control transistor, and $Q_6$ as the output transistor. If each limb is generalized to contain M transistors, then the translinear equations become $$J_O \prod_O J = J_C \prod_C J = J_R \prod_R J \quad [21]$$

where "O", "C" and "R" stand for the output, control and reference limbs, respectively, and $J_O$, $J_C$, and $J_R$ represent the collector current densities through the output, control and reference transistors, $Q_6$, $Q_4$, $Q_1$, respectively. The output, control and reference transistors $Q_6$, $Q_4$, $Q_1$, have been listed as explicit terms, leaving M−1 terms in each product. If these products are treated as variables, then equation [20] reduces to $$J_O \Pi_O = J_C \Pi_C = J_R \Pi_R \quad [22]$$

In this equation, $J_O$ is a dependent variable, and therefore the value of $J_O \Pi_O$ will be constrained by one of the other terms. The value of $J_C$ cannot exceed the limiting value $J_L$, defined as $$J_L = \frac{I_L}{A_{EC}} \quad [23]$$

where $I_L$ is the current provided by the source connected to the collector of the control transistor, and $A_{EC}$ is the emitter area of the control transistor. While $J_C < J_L$, $J_R$ will equal the current $J_I$ from the current source connected to the collector of the input transistor, $J_O$ will then equal $$J_O = \frac{J_I \Pi_R}{\Pi_O} \quad [24]$$

When $J_C \geq J_L$, the output current $J_O$ will be determined by the control limb, where $J_C = J_L$, $$J_O = \frac{J_L \Pi_C}{\Pi_O} \quad [25]$$

Combining [23] and [24], and expressing the limiting inequalities in terms of $J_I$, $$J_O = \begin{cases} \frac{J_I \Pi_R}{\Pi_O} & \text{for } J_I < \frac{J_L \Pi_C}{\Pi_R} \\ \frac{J_L \Pi_C}{\Pi_O} & \text{for } J_I \geq \frac{J_L \Pi_C}{\Pi_R} \end{cases} \quad [26]$$

Trafton-Hastings clamps can be cascaded to generate a piecewise-polynomial-continuous function of more than two segments. FIG. 5 shows a translinear network 32 that generates a three-segment piecewise-polynomial-continuous function.

The circuit 34 of FIG. 5 contains a primary Trafton-Hastings clamp including the control transistor $Q_4$ and the reference transistor $Q_1$. The circuit 34 also contains a secondary Trafton-Hastings clamp including the control transistor $Q_6$ and the reference transistor $Q_3$. Although each limb of the circuit 34 contains only two transistors, clearly any number can be present. Similarly, the circuit can be elaborated to include additional subordinate clamps. In a fully generalized case, the circuit may also include more than one output limb.

A generalized translinear network containing $N_C$ cascaded Trafton-Hastings clamps will have $N_C + 1$ segments in its piecewise-polynomial-continuous output functions, the first of which corresponds to the condition where the primary clamp has not yet reached its compliance limit, and the $N_O$ output functions $J_O$ equal $$J_{O_1} = \frac{J_{I_1} \Pi_R}{\Pi_O} \text{ for } J_I < \frac{J_{L_1} \Pi_C}{\Pi_R} \qquad [27]$$

The second segment of the output function(s) appear when the first Trafton-Hastings clamp has reached its limit, but the second has not, $$J_{O_i} = \frac{J_{L_2} J_{I_3} \Pi_{C_2}}{\Pi_O} \text{ for } \frac{J_{L_1} J_{I_2} \Pi_{C_1}}{\Pi_R} \leq J_{I_1} < \frac{J_{L_2} J_{I_3} \Pi_{C_2}}{\Pi_R} \qquad [28]$$

Generalizing, for the $n^{th}$ segment of the output function(s), $$J_{O_i} = \frac{J_{L_n} J_{I_{n+1}} \Pi_{C_n}}{\Pi_O} \text{ for } \frac{J_{L_n} J_{I_{n+1}} \Pi_{C_n}}{\Pi_R} \leq J_{I_n} < \frac{J_{L_{n+1}} J_{I_{n+2}} \Pi_{C_{n+1}}}{\Pi_R} \qquad [29]$$

All translinear networks that generate piecewise-polynomial-continuous functions of the form P/Q have singular points in their output solutions, caused when terms in the denominator Q go to zero. Most of these cause the output to increase without limit, as would be the case of the simple reciprocal function Y=1/X when X→0. These singularities are essential to the function, in that it is impossible to compute Y at points arbitrarily close to X=0 without accounting for the singularity at X=0. On the other hand, some singularities are removable, in that they do not affect the value of the function at any point except at the singularity itself. For example, the following equation, encountered in the limited reciprocator discussed above, has an removable singularity at $I_X$=0.

$$I_Y = \frac{I_X}{I_X} I_C \qquad [30]$$

In this function, $I_Y=I_C$ for all values of $I_X$ except $I_X$=0, where $I_Y$ becomes undefined. This sort of removable singularity actually affects the operation of a practical realization of the function using a Trafton-Hastings clamped translinear network. FIG. 2 shows the network that implements equation [30], and when $I_X$=0, transistors $Q_3$ and $Q_5$ become unbiased and the output of the circuit becomes undefined. How close the circuit will operate to the singularity depends upon the degree to which beta and other nonidealities have been compensated. In practice, there always exists a small region about $I_X$=0 in which the output behaves erratically.

SUMMARY OF THE INVENTION

One of the advantages of the method and circuit of the invention is that the effects of removable singularities in the operation of translinear loops are reduced or eliminated.

Another advantage of the method and circuit of the invention is that translinear networks can be provided that have greater immunity to disturbance by leakage currents and electrical noise.

Still another advantage of the method and a circuit of the invention is that a perturbation of the removable singularities can be provided to enable a larger finite operating range of reciprocators, piecewise-polynomial-continuous function generators, and other circuits that have a P/Q polynomial function transfer form.

According to a preferred embodiment of the invention, a removable singularity existing in the piecewise-polynomial-continuous transfer function of a Gilbert circuit incorporating a Trafton-Hastings clamp is perturbed into the left half-plane by addition of a perturbation quantity d to a term X that appears in both denominator and numerator of the function and which is responsible for generation of the singularity. Because the denominator of the piecewise-polynomial-continuous transfer function is invariant and the numerator of the function changes depending upon the region of operation, the value of the perturbation quantity d must equal zero in all regions in which "X" does not appear in the numerator. In a preferred embodiment, perturbation quantity d is realized in a circuit utilizing waste currents generated by a Trafton-Hastings clamp.

Thus, according to a broad aspect of the invention, a method for operating a circuit having first and second bipolar transistors within a translinear loop includes detecting when collector currents in the first and second bipolar transistors simultaneously approach zero and in response drawing an additional current through each of the first and second bipolar transistors so as to maintain their base-emitter bias voltages at definite and equal values.

According to another broad aspect of the invention, a translinear circuit is presented that implements a piecewise-polynomial-continuous function containing a removable singularity in at least one segment thereof. The circuit includes a plurality of input transistors for receiving a respective plurality of input currents and a circuit for providing a plurality of perturbation currents when the translinear circuit operates within the at least one segment containing a removable singularity. The translinear circuit is configured to add the perturbation currents to those of the input currents received by the input transistors that are responsible for creating the removable singularity. In one embodiment, the input currents may be substantially equal and in another embodiment, the perturbation currents may be substantially equal. The circuit for providing the perturbation currents may include a Trafton-Hastings clamp transistor connected to provide a collector current that indicates when the input currents that are responsible for creating the removable singularity are substantially equal.

According to still another broad aspect of the invention, a method is presented for operating a translinear circuit implementing a piecewise-polynomial-continuous function containing a removable singularity in at least one segment thereof The method includes applying a plurality of input currents to a respective plurality of input transistors, generating a plurality of perturbation currents when the translinear circuit operates within the at least one segment containing a removable singularity, and allowing the translinear circuit to add the perturbation currents to those of the input currents received by the input transistors that are responsible for creating the removable singularities.

The step of generating a plurality of perturbation currents may include generating a plurality of substantially equal perturbation currents. The step of providing the perturbation currents may include connecting a Trafton-Hastings clamp transistor to provide a collector current that indicates when the input currents that are responsible for creating the removable singularities are substantially equal. The step of connecting a Trafton-Hastings clamp transistor may include connecting the Trafton-Hastings clamp transistor to produce a collector current that substantially differs from zero when the input currents that are responsible for creating the removable singularities are substantially equal, or alternatively, connecting the Trafton-Hastings clamp transistor to produce a collector current that substantially equals zero when the input currents that are responsible for creating the removable singularities are substantially equal.

According to yet another broad aspect of the invention, a method is presented for perturbing a removable singularity in a piecewise-polynomial-continuous transfer function of a translinear circuit of the type that incorporates a Trafton-Hastings clamp. The method includes detecting a region of operation in which a removable singularity exists within a transfer function of the translinear circuit, determining a plurality of input currents to the translinear circuit whose magnitude substantially equals zero at the removable singularity, and defining a plurality of substantially equal perturbation currents. The method is performed so that respective ones of the plurality of perturbation currents are added to each of the input currents within the region of operation.

According to still another broad aspect of the invention, a translinear circuit is presented. The translinear circuit has a pair of translinear loops which include a respective plurality of bipolar input transistors, each receiving a respective input current. A current mirror is provided having a plurality of outputs, each connecting to a respective one of the bipolar input transistors. A Trafton-Hastings clamp transistor is also provided. The clamp transistor has a collector current coupled to control the outputs of the current mirror, and is coupled to the translinear loops to produce the collector current when the input currents cause the translinear circuit to operate in a segment of a piecewise-polynomial-continuous characteristic function having a removable singularity. The circuit operates such that the outputs from the current mirror add to the input currents in the bipolar input transistors.

According to still yet another broad aspect of the invention, a translinear circuit is provided having two translinear loops. The circuit includes a plurality of bipolar input transistors and a current mirror having a plurality of output currents to add to currents in the bipolar input transistors. A current source, a control transistor, and a Trafton-Hastings clamp transistor are provided. The Trafton-Hastings clamp transistor has a base coupled to the current source and to a collector of the control transistor, A difference between a current delivered by the current source and a current consumed by the control transistor is coupled to the current mirror to be mirrored to the output currents.

According to still yet another broad aspect of the invention, a circuit is provided that includes a reference limb, a control limb, and an output limb. The reference limb includes a first bipolar transistor having an emitter coupled to a voltage rail and a second bipolar transistor having an emitter coupled to a base of the first bipolar transistor. The control limb includes a third bipolar transistor having an emitter coupled to a voltage rail and a fourth bipolar transistor having an emitter coupled to a base of the third bipolar transistor. The output limb includes a fifth bipolar transistor having an emitter coupled to a voltage rail and a sixth bipolar transistor having an emitter coupled to a base of the fifth bipolar transistor. The second, fourth, and sixth bipolar transistors have bases coupled to a collector of the first bipolar transistor. A first constant current source is coupled to the collector of the first bipolar transistor, a second constant current source is coupled to the emitter of the second bipolar transistor, and a third constant current source is coupled to a collector of the third bipolar transistor. A first input is coupled to the emitter of the fourth bipolar transistor and a second input coupled to the emitter of the sixth bipolar transistor. A current mirror is provided that has outputs coupled to the emitters of the fourth and sixth bipolar transistors. A Trafton-Hastings clamp bipolar transistor has a base coupled to the collector of the third bipolar transistor, an emitter coupled to the collector of the first bipolar transistor, and a collector coupled to an input of the current mirror. A circuit output is coupled to a collector of the fifth bipolar transistor.

BRIEF DESCRIPTION OF THE DRAWING

The invention is illustrated in the accompanying drawing, in which.

In the various figures of the drawing, like reference numerals are used to denote like or similar parts.

DETAILED DESCRIPTION OF A PREFERRED EMBODIMENT

As mentioned above, translinear networks that generate piecewise-polynomial-continuous functions of the form P/Q have singular points in their output solutions, caused when terms in the denominator Q go to zero. Most of these cause the output to increase without limit, as would be the case of the simple reciprocal function Y=1/X when X→0. Because these singularities are essential to the function, it is impossible to compute Y at points arbitrarily close to X=0 without accounting for the singularity at X=0. On the other hand, some singularities are removable, in that they do not affect the value of the function at any point except at the singularity itself. This sort of removable singularity actually affects the operation of a practical realization of the function using a Trafton-Hastings clamped translinear network. How close the circuit will operate to the singularity depends upon the degree to which beta and other nonidealities have been compensated. In practice, there always exists a small region about $I_x=0$ in which the output behaves erratically.

Thus, according to the invention, a removable singularity can be perturbed by adding an arbitrarily small quantity δ to the term that exists both in the numerator and the denominator and which is responsible for the singularity. This effectively displaces the singularity by a distance δ. This perturbation has no effect upon the value of the function. In the case of the function [30], the addition of a perturbation δ transforms the function to $$I_Y = \frac{I_X + \delta}{I_X + \delta} I_C \quad [31]$$

If the singularity is perturbed sufficiently to displace it into the left half-plane, then it cannot affect the operation of a physical translinear circuit, for which all terms in the polynomial are, by definition, greater than or equal to zero. The size of the perturbation δ must be large enough to ensure that sufficient bias always exists on the transistors that would otherwise become unbiased in the vicinity of the singularity. This generally means that the perturbation must be several percent of the full-scale value of the associated input variable.

Figure 1A:
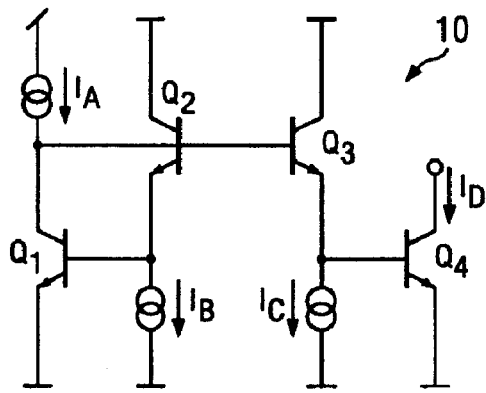
FIG. 1A is a translinear circuit, according to the prior art.
Figure 1B:
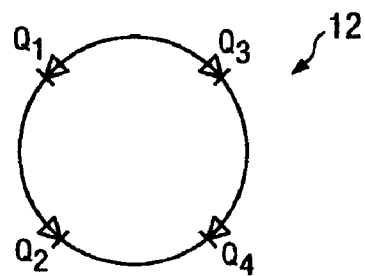
FIG. 1B is a translinear loop contained in the translinear circuit of FIG. 1A, according to the prior art.
Figure 2:
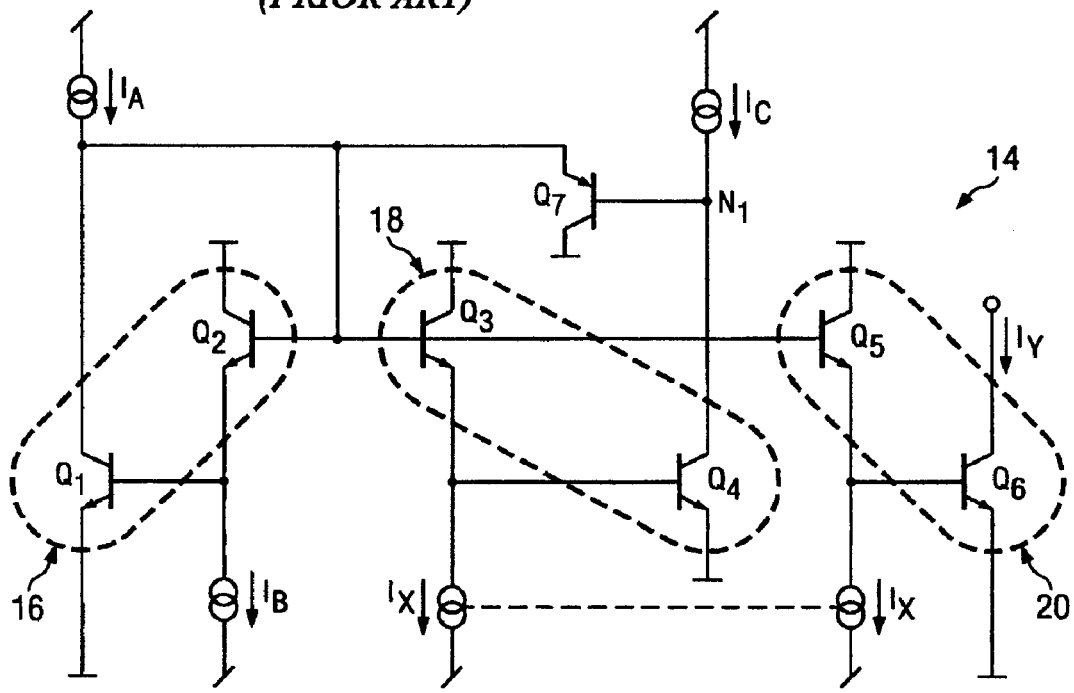
FIG. 2 is a circuit diagram of a reciprocator circuit using a normal Trafton-Hastings clamp, according to the prior art.
Figure 3:
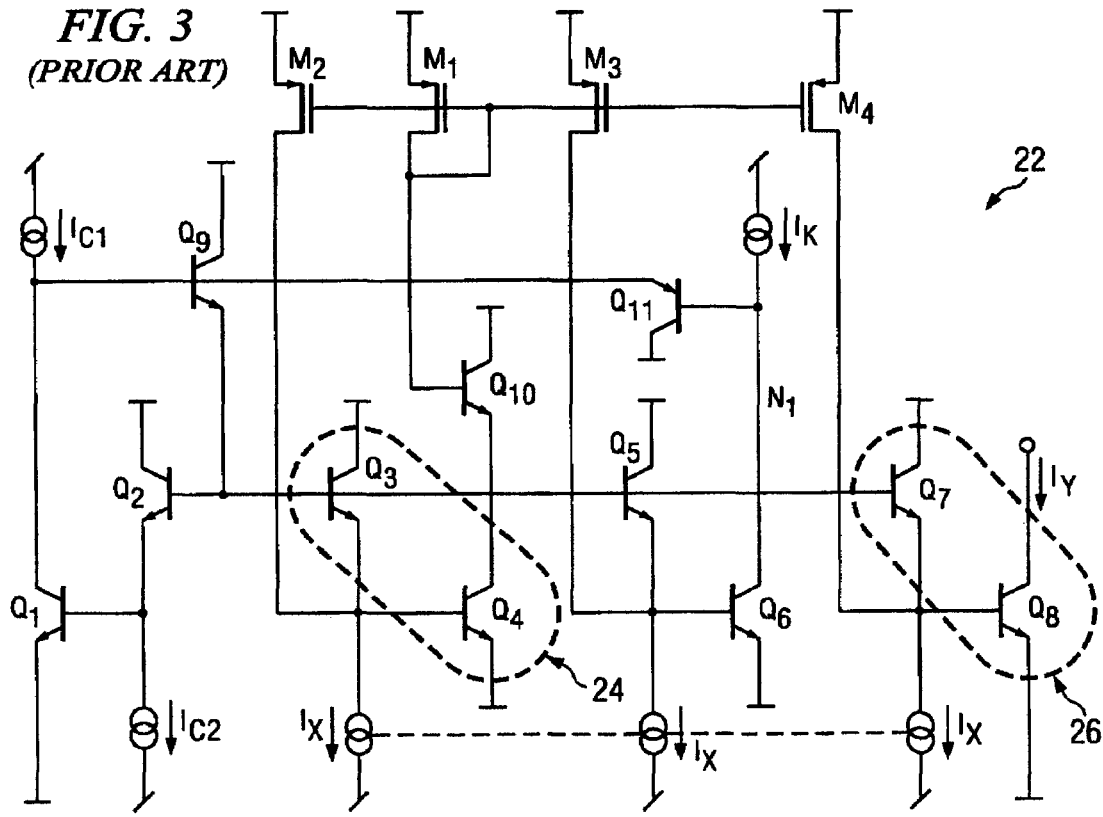
FIG. 3 is a reciprocator circuit with beta correction, according to the prior art.
Figure 4:
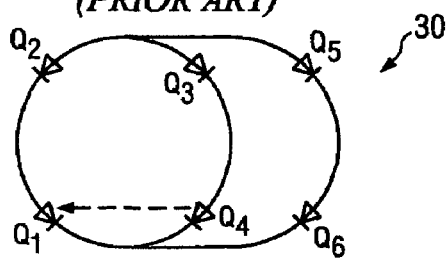
FIG. 4 is a simplified schematic of the circuit of FIG. 2, according to the prior art.
Figure 5:
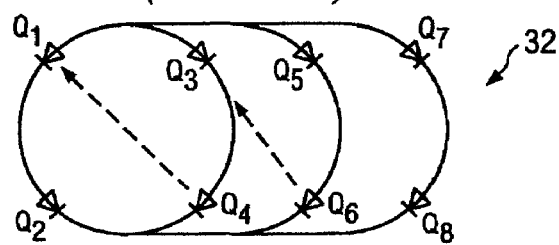
FIG. 5 is a simplified schematic of a multi-stage translinear circuit that uses cascaded Trafton-Hastings clamps, according to the prior art.

The denominator term of a piecewise-polynomial-continuous function realized by a Trafton-Hastings clamp is $\Pi_O$ (or its generalized equivalent $\Pi_{Oi}$). The numerator, on the other hand, varies depending upon what region of the function one considers. Therefore, attempting to perturb an removable singularity will alter the value of the function in at least one of its regions. In order to avoid this, the perturbation must be inserted into only the equation for the region in which the singularity occurs. For the circuit 14 of FIG. 2, this means that the perturbation should only appear when the clamp saturates.

Figure 6:
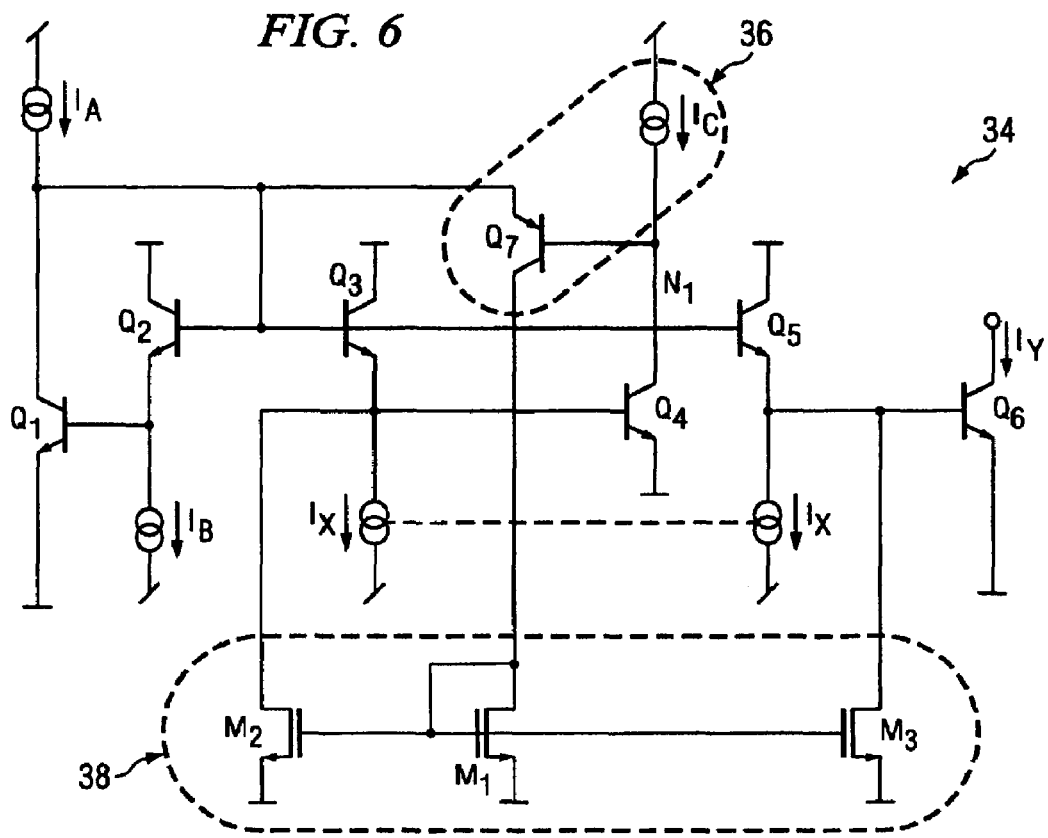
FIG. 6 is a schematic diagram of a reciprocator circuit including perturbation circuitry, in accordance with a preferred embodiment of the invention.

FIG. 6, to which reference is now made, shows a circuit 34 in which such a conditional perturbation may be introduced, according to a preferred embodiment of the invention. In the schematic diagram of the circuit 34, details of beta corrector circuitry is omitted for clarity, but would be included, for example, in the manner discussed above with regard to the circuit 14 of FIG. 2.

In the circuit 34, a current mirror 38 is provided that includes transistors $M_1$, $M_2$ and $M_3$. The circuit also includes a Trafton-Hastings clamp 36, which includes a control transistor $Q_7$ and a current source $I_C$. The current mirror 38 uses the waste current from the Trafton-Hastings clamp 36 to control the removable singularity caused by currents $I_X$ approaching zero. Although this circuit contains only one Trafton-Hastings clamp, more complex circuits can contain two or more such clamps. Each additional Trafton-Hastings clamp generates an additional region in the piecewise-polynomial-continuous function that can potentially contain one or more removable singularities. Additional current mirrors utilizing the waste currents from the additional Trafton-Hastings clamps can be used to perturb these removable singularities in a manner analogous to the operation of current source 38 together with Trafton-Hastings clamp 36.

In operation, the Trafton-Hastings clamp transistor $Q_7$ will conduct no current so long as $I_X > I_A I_B / I_C$. Below this critical value, $Q_7$ will be biased into conduction, and mirror 38 will begin to operate. Suppose that transistors $M_1$, $M_2$ and $M_3$ have the following relationship in sizes:

$$\left(\frac{W}{L}\right)_{M2} = \left(\frac{W}{L}\right)_{M3} = k\left(\frac{W}{L}\right)_{M1} \quad [32]$$

Analyzing around the translinear loop $Q_1$-$Q_2$-$Q_3$-$Q_4$ when $I_X < I_A I_B / I_C$, assuming all transistors have infinite beta, $$(I_A - I_{E7})I_B = (I_X + kI_{E7})I_C \quad [33]$$

where $I_{E7}$ is the emitter current of $Q_7$. Solving for $I_{E7}$, $$I_{E7} = \frac{I_A I_B - I_C I_X}{kI_C + I_B} \quad [34]$$

Analyzing around translinear loop $Q_4$-$Q_3$-$Q_5$-$Q_6$ when $I_X < I_A I_B / I_C$, $$I_C(I_X + kI_{E7}) = (I_X + kI_{E7})I_Y \quad [35]$$

Solving for $I_Y$, $$I_Y = \frac{I_X + k\left(\frac{I_A I_B - I_C I_X}{kI_C + I_B}\right)}{I_X + k\left(\frac{I_A I_B - I_C I_X}{kI_C + I_B}\right)} I_C \quad [36]$$

This equation reduces to $I_C$ for all values of $I_X$ except at a removable singularity, which occurs at:

$$I_X = -k\left(\frac{I_A I_B - I_C I_X}{kI_C + I_B}\right) \quad [37]$$

This equation reduces to $I_X = -kI_A$. Therefore, the addition of mirror $M_1$-$M_2$-$M_3$ perturbs the removable singularity at $I_X = 0$ into the left half-plane by a distance $kI_A$. This allows the operation of the circuit at $I_X = 0$, and indeed at $I_X > -kI_A$.

A removable singularity may also occur in a region of the piecewise-polynomial-continuous function in which the Trafton-Hastings clamp is not biased into conduction. In such cases, the perturbation current can be derived from the current source that forms part of the clamp. This current source will normally take the form of a current mirror constructed using either bipolar or MOS transistors, an example of which is shown in the circuit 40 of FIG. 7A, to which reference is now additionally made.

In the circuit 40, transistor $Q_2$ mirrors the current in transistor $Q_1$, and acts as the current source to the Trafton-Hastings clamp transistor $Q_{TH}$. When this current source begins to saturate, current is diverted to the secondary or ring collector 42, generating a perturbation current $I_P$ that can be fed to a current mirror (not shown) to perturb the appropriate input terms. More particularly, in the case of a bipolar current mirror constructed using lateral PNP transistors, a structure called a ring collector offers a particularly simple means of generating the perturbation current. Typically, on a lateral PNP transistor, the collector is formed as a ring around the emitter. A second emitter, referred to as a "ring collector," can be placed outside of the first one. This outer emitter is usually shaped to form a second ring enclosing, or ringing, the inner collector. In the normal active mode ($V_{CE} > V_{sat}$), the vast majority of the current flows from the emitter to the inner collector, which is shown connected to $Q_{TH}$ in FIG. 7A. When the inner collector saturates ($V_{CE} \leq V_{sat}$), then a substantial portion of the current not collected by the inner collector will flow to the outer, or ring collector (element 42 in FIG. 7A). Further details of the construction of a ring collector are found in Hastings, *The Art of Analog Layout*, Prentice Hall, 2000, pp. 319-322, which is incorporated herein by reference.

Figure 7A:
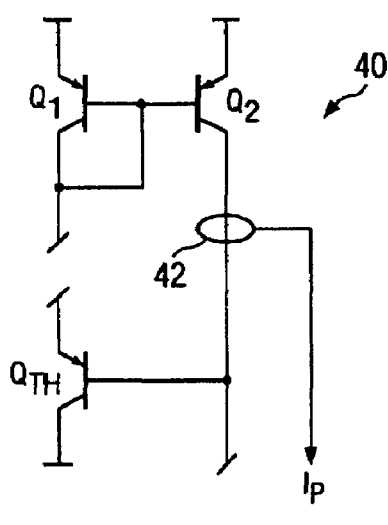
FIG. 7A is a circuit for perturbing an removable singularity in control and reference limbs of a multi-stage translinear circuit, in accordance with a preferred embodiment of the invention.

In the circuit of FIG. 7A, the ring collector generates a perturbation current that would be coupled by means of a current mirror into the transistors whose collector currents are responsible for generating the removable singularity. The ring collector will generate a nonzero current while the Trafton-Hastings clamp transistor $Q_{TH}$ is not conducting, that is, the Trafton-Hastings clamp transistor is connected to produce a collector current that substantially equals zero when the input currents that are responsible for creating said removable singularities are substantially equal. That is, it will generate a current that substantially equals zero current when $Q_{TH}$ is conducting.

Figure 7B:
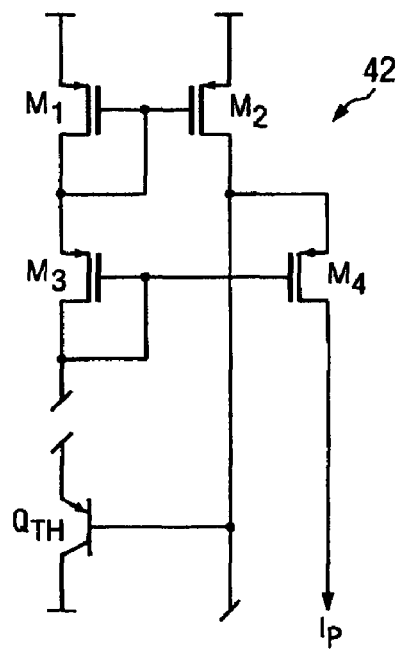
FIG. 7B is another circuit for perturbing an removable singularity in control and reference limbs of a multi-stage translinear circuit, in accordance with another preferred embodiment of the invention.

Another approach suitable for use with MOS transistors is shown in FIG. 7B. The circuit 42 of FIG. 7B, to which reference is now additionally made, operates similarly. The circuit 42 includes MOS transistors $M_1$-$M_4$. Transistor $M_2$ mirrors the current in transistor $M_1$. Transistor $M_2$ acts as the current source to Trafton-Hastings clamp transistor $Q_{TH}$. As this current source begins to saturate, the voltage at the drain of $M_2$ rises high enough to bias transistor $M_4$ into conduction, generating a perturbation current $I_P$. The circuit of FIG. 7B can also be used with bipolar transistors as well as MOS transistors. This implementation may therefore be used where a ring collector is either infeasible or undesirable.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

The invention claimed is:

1. A translinear circuit implementing a piecewise-polynomial-continuous function containing a removable singularity in at least one segment thereof, comprising:
   a plurality of input transistors for receiving a respective plurality of input currents; and
   a circuit for providing a plurality of perturbation currents when said translinear circuit operates within said at least one segment containing a removable singularity, said circuit comprising:
      a Trafton-Hastings clamp transistor connected to provide a collector current that indicates when said input currents that are responsible for creating said removable singularity are substantially equal; and
      a current mirror controlled by said Trafton-Hastings clamp transistor to supply said perturbation currents to said input transistors;
   wherein said translinear circuit is configured to add said perturbation currents to those of said input currents received by said input transistors that are responsible for creating said removable singularity.

2. The circuit of claim 1 wherein said input currents are substantially proportional.

3. The circuit of claim 1 wherein said perturbation currents are substantially equal.

4. The circuit of claim 1 wherein said input transistors are bipolar transistors.

5. The circuit of claim 1 wherein said Trafton-Hastings clamp transistor is connected to produce a collector current that substantially differs from zero when said input currents that are responsible for creating said removable singularities are substantially equal.

6. The circuit of claim 5 wherein said perturbation currents are substantially proportional to said collector current of said Trafton-Hastings clamp transistor.

7. The circuit of claim 1 wherein said Trafton-Hastings clamp transistor is connected to produce a collector current that substantially equals zero when said input currents that are responsible for creating said removable singularities are substantially proportional.

8. The circuit of claim 1 further comprising a current source and a control transistor, connected in series, wherein a base of said Trafton-Hastings clamp transistor is connected to a node between said current source and said control transistor, and wherein said plurality of perturbation currents are substantially proportional to a difference between a current delivered by the current source and a current consumed by said control transistor.

9. A method for operating a translinear circuit implementing a piecewise-polynomial-continuous function containing a removable singularity in at least one segment thereof, comprising:
   applying a plurality of input currents to a respective plurality of input transistors;
   generating a plurality of perturbation currents when said translinear circuit operates within said at least one segment containing a removable singularity by:
      connecting a Trafton-Hastings clamp transistor to provide a collector current that indicates when said input currents that are responsible for creating said removable singularities are substantially proportional; and
      providing a current mirror controlled by said Trafton-Hastings clamp transistor to supply said perturbation currents to said input transistors;
      and allowing said translinear circuit to add said perturbation currents to those of said input currents received by said input transistors that are responsible for creating said removable singularities.

10. The method of claim 9 wherein said generating a plurality of perturbation currents comprises generating a plurality of substantially equal perturbation currents.

11. The method of claim 9 wherein said connecting a Trafton-Hastings clamp transistor comprises connecting a Trafton-Hastings clamp transistor to produce a collector current that substantially differs from zero when said input currents that are responsible for creating said removable singularities are substantially proportional.

12. The method of claim 11 wherein said providing said perturbation currents comprises providing perturbation currents that are substantially proportional to said collector current of said Trafton-Hastings clamp transistor.

13. The method of claim 9 wherein said connecting a Trafton-Hastings clamp transistor comprises connecting a Trafton-Hastings clamp transistor to produce a collector current that substantially equals zero when said input currents that are responsible for creating said removable singularities are substantially proportional.

14. The method of claim 9 further comprising providing a current source in series with a control transistor, 2 connecting a base of said Trafton-Hastings clamp transistor to a node between said current source and said control transistor, wherein said plurality of perturbation currents are substantially proportional to a difference between a current delivered by the current source and a current consumed by said control transistor.

15. A translinear circuit, comprising:
   a pair of translinear loops, including a respective plurality of bipolar input transistors each receiving a respective input current;
   a current mirror having a plurality of outputs each connecting to a respective one of said bipolar input transistors; and
   a Trafton-Hastings clamp transistor having a collector current coupled to control said outputs of said current mirror, said Trafton-Hastings clamp transistor being coupled to said translinear loops and operating to produce said collector current when said input currents cause said translinear circuit to operate in a segment of a piecewise-polynomial-continuous characteristic function having a removable singularity;

wherein said outputs from said current mirror add to said input currents in said bipolar input transistors.

16. A translinear circuit having two translinear loops, comprising:

a plurality of bipolar input transistors;

a current mirror having a plurality of output currents to add to currents in said bipolar input transistors;

a current source;

a control transistor;

a Trafton-Hastings clamp transistor having a base coupled to said current source and to a collector of said control transistor, a difference between a current delivered by said current source and a current consumed by said control transistor being coupled to said current mirror to be mirrored to said output currents.

17. A circuit comprising:

a reference limb, a control limb, and an output limb, said reference limb comprising:

a first bipolar transistor having an emitter coupled to a voltage rail, and a second bipolar transistor having an emitter coupled to a base of said first bipolar transistor;

said control limb comprising:

a third bipolar transistor having an emitter coupled to a voltage rail, and a fourth bipolar transistor having an emitter coupled to a base of said third bipolar transistor;

said output limb comprising:

a fifth bipolar transistor having an emitter coupled to a voltage rail, and a sixth bipolar transistor having an emitter coupled to a base of said fifth bipolar transistor;

said second, fourth, and sixth bipolar transistors having bases coupled to a collector of said first bipolar transistor;

a first constant current source coupled to said collector of said first bipolar transistor;

a second constant current source coupled to said emitter of said second bipolar transistor;

a third constant current source coupled to a collector of said third bipolar transistor, a first input coupled to said emitter of said fourth bipolar transistor;

a second input coupled to said emitter of said sixth bipolar transistor;

a current mirror having outputs coupled to said emitters of said fourth and sixth bipolar transistors;

a Trafton-Hastings clamp bipolar transistor, having a base coupled to said collector of said third bipolar transistor, an emitter coupled to said collector of said first bipolar transistor, and a collector coupled to an input of said current mirror; and and a circuit output coupled to a collector of said fifth bipolar transistor.

18. The circuit of claim 17, wherein a first current is passed through said first input and a second current is passed through said second input, and wherein said first and second currents are substantially equal.

* * * * *